United States Patent
Yu et al.

(10) Patent No.: US 7,619,888 B2
(45) Date of Patent: Nov. 17, 2009

(54) FLAT HEAT COLUMN AND HEAT DISSIPATING APPARATUS THEREOF

(75) Inventors: Min-Hui Yu, Taoyuan Hsien (TW); Chi-Feng Lin, Taoyuan Hsien (TW); Chin-Ming Chen, Taoyuan Hsien (TW)

(73) Assignee: Delta Electronics, Inc., Taoyuan Hsien (TW)

( * ) Notice: Subject to any disclaimer, the term of this patent is extended or adjusted under 35 U.S.C. 154(b) by 39 days.

(21) Appl. No.: 11/984,504

(22) Filed: Nov. 19, 2007

(65) Prior Publication Data

US 2008/0130230 A1      Jun. 5, 2008

(30) Foreign Application Priority Data

Dec. 1, 2006      (TW)      ............... 95144579 A

(51) Int. Cl.
*H05K 7/20*      (2006.01)
*F28F 7/00*      (2006.01)

(52) U.S. Cl. ............. 361/697; 165/80.3; 165/104.33; 165/121; 165/185; 361/700; 361/703

(58) Field of Classification Search ............ 165/104.33; 361/700

See application file for complete search history.

(56) References Cited

U.S. PATENT DOCUMENTS

| | | | | |
|---|---|---|---|---|
| 5,412,535 A | * | 5/1995 | Chao et al. | 361/700 |
| 2002/0185263 A1 | * | 12/2002 | Wagner et al. | 165/104.33 |
| 2003/0189813 A1 | * | 10/2003 | Lee | 361/704 |
| 2004/0035558 A1 | * | 2/2004 | Todd et al. | 165/104.26 |
| 2004/0100771 A1 | * | 5/2004 | Luo | 361/700 |
| 2004/0105235 A1 | * | 6/2004 | Lai | 361/700 |
| 2005/0011633 A1 | * | 1/2005 | Garner et al. | 165/104.26 |
| 2005/0082043 A1 | * | 4/2005 | Sarraf | 165/104.33 |
| 2006/0109628 A1 | * | 5/2006 | Searby | 361/697 |
| 2007/0102143 A1 | * | 5/2007 | Yu et al. | 165/80.3 |
| 2007/0188992 A1 | * | 8/2007 | Hwang et al. | 361/700 |
| 2008/0017350 A1 | * | 1/2008 | Hwang et al. | 165/80.3 |

* cited by examiner

*Primary Examiner*—Gregory D Thompson
(74) *Attorney, Agent, or Firm*—Birch, Stewart, Kolasch & Birch, LLP

(57) ABSTRACT

A heat dissipating module includes a heat dissipating apparatus and a fan. The fan is disposed adjacent to a side of the heat dissipating apparatus. A heat dissipating apparatus includes a flat heat column and a plurality of heat dissipating fins. The heat dissipating fins are disposed at the exterior of the flat heat column. A flat heat column has a pipe-body and a base, and the pipe-body includes a circular sidewall, an open end and a closed end. The base is coupled to the circular sidewall at the open end to form a closed space in the flat heat column, wherein the circular sidewall converges from the open end toward the closed end to form a converging part and a flat part.

19 Claims, 13 Drawing Sheets

FLAT HEAT COLUMN AND HEAT DISSIPATING APPARATUS THEREOF

This Non-provisional application claims priority under U.S.C.§ 119(a) on Patent Application No(s). 095144579, filed in Taiwan, Republic of China on Dec. 1, 2006, the entire contents of which are hereby incorporated by reference.

BACKGROUND OF THE INVENTION

1. Field of the Invention

The invention relates to a heat column and a heat dissipating apparatus contained therein, and more particularly to a flat heat column with reduced airflow resistance, and a heat dissipating apparatus containing the flat heat column.

2. Description of the Related Art

As efficacy of electronic products continuous increased, heat dissipating apparatuses play a critical role in electronic apparatuses. Poor heat dissipation can lead to damage or failure for the entire electronic products.

Heat dissipating apparatuses are important in microelectronic elements, (e.g. integrated circuit, IC). Due to the increase of integration and advancement of packaging technology, integrated circuit area is increasingly reduced and the heat per unit area is thus increased. Thus, high efficacy heat dissipating apparatuses are under continuous active development by electronic industry.

Heat pipes are widely used in electronic products because they are capable of dissipating a great amount of heat from a heat source through a small contact area without requiring additional power. In general, heat pipes are used with heat sink and a fan so that heat generated from the heat source can be transferred to the heat pipe, and then rapidly dissipated through the fins of the heat sink. Also, the fan provides airflows for dissipating the heat by heat convection.

FIG. 1A is a schematic view of a conventional heat dissipating module. A conventional heat-dissipating module 1 is constituted by a cylindrical heat pipe 11, a heat sink 12 and an axial fan 13 located at the side of the heat sink 12 for lateral blowing airflows to dissipate heat from a heat-generating electronic apparatus (hereafter the heat source, not shown). When the cylindrical heat pipe 11 contacts the underlying heat source, the work fluid at the vapor end of the cylindrical heat pipe 11 is transformed to vapor by absorbing heat. The vapor is transported to wick structures at the cooling end by pressure. The vaporized work fluid is transformed to liquid by releasing the latent heat therein. The liquid work fluid is then transported back to the vapor end by wick structures disposed at the inner wall of the cylindrical heat pipe 11. The heat at the cooling end is conducted to the heat sink 12 via heat conduction and airflow generated by the fan 13 exhausts the heat to the environment via heat convection.

FIG. 1B is a schematic view of the fluid field of the heat dissipating module. In this dissipating process of heat dissipating module, airflow "A" generated by the fan 13 is dispersed when passing the cylindrical heat pipe 11, causing a large stagnant zone "B" after the cylindrical heat pipe 11 is generated. Thus, no heat convection occurs in the stagnant zone B, which reduces the entire efficiency of the heat dissipating module. In addition, the heat sink 12, formed by pressing and engaging, are typically chosen to match the cylindrical heat pipe 11. The manufacturing cost of this type of heat sink 12 is, however, higher.

BRIEF SUMMARY OF THE INVENTION

To avoid the problems of the conventional circular heat pipe, the invention provides a flat heat column with reduced wind-resistance and a reduced stagnant zone for promoting the average heat dissipation efficiency. Furthermore, the heat sink, coupled to the flat heat column of the invention, can be manufactured by pressing, locking, or even aluminum extrusion, which is both simple and economic.

An embodiment of the flat heat column of the invention includes a pipe body and a base. The pipe body includes a circular sidewall, an open end and a closed end. The open end and the closed end are oppositely disposed on two ends of the circular sidewall, respectively. The circular sidewall converges from the open end toward the closed end to form a converging part and a flat part, and the closed end connected to the converging part is formed by pressing. The base is coupled to the circular sidewall at the open end to form a closed space in the flat heat column. The side of the converging part of the circular sidewall is bell-shaped and the dimension of the open end of the pipe body match the base.

The pipe body and the base include a high thermally conductive material such as copper, silver, aluminum or combinations thereof. The base contacts a heat source which is an electronic device generating heat, such as a central processing unit(CPU), a transistor, a server, an advanced graphics card, a hard disk drive, a power supply, a traffic control system, an electronic multimedia apparatus, a wireless communication base station or a game console.

Another embodiment of the heat dissipating apparatus includes the foregoing flat heat column and a plurality of heat dissipating fins. The heat dissipating fins are disposed at the exterior of the flat heat column and connect to the converging part and the flat part. The heat dissipating fins connected to the flat part are of the first length. The heat dissipating fins connected to the converging part are of the second length. The first length is longer than the second length. The heat dissipating fins are produced by extrusion, clipping and locking, pressing or other method. The heat dissipating fins and the flat heat column are connected by tightly pressing, welding or other equivalent ways. A solder paste, a silicon heat conductive paste or a thermally conductive material is disposed between the heat dissipating fins and the flat heat column. The heat dissipating fins are arranged in a horizontal direction or vertical direction, or extend slantingly or radially.

Another embodiment of the heat dissipating module includes a heat dissipating apparatus and a fan. The fan is disposed adjacent to a side of the heat dissipating apparatus and is secured by embedding, engaging, screwing, or similar, wherein the fan generates airflows to improve the heat dissipating efficiency of the heat dissipating fan. The heat dissipating apparatus includes the foregoing flat heat column and a plurality of foregoing heat dissipating fins.

In the foregoing flat heat column, flat heat column further includes a wick structure and a working fluid. The wick structure is disposed on the circular sidewall and the base and is made by plastic, metal, alloy, porous metallic material or combinations thereof. The working fluid is disposed within the flat heat column and includes an inorganic compound, pure water, alcohol, ketone, liquid metal, coolant, an organic compound or combinations thereof.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The process for fabricating the flat heat column 20 is illustrated first in the following detailed description. Please refer to FIGS. 2A-2E which depict a process of fabricating a flat heat column in accordance with an embodiment of the invention.

Figure 1A:
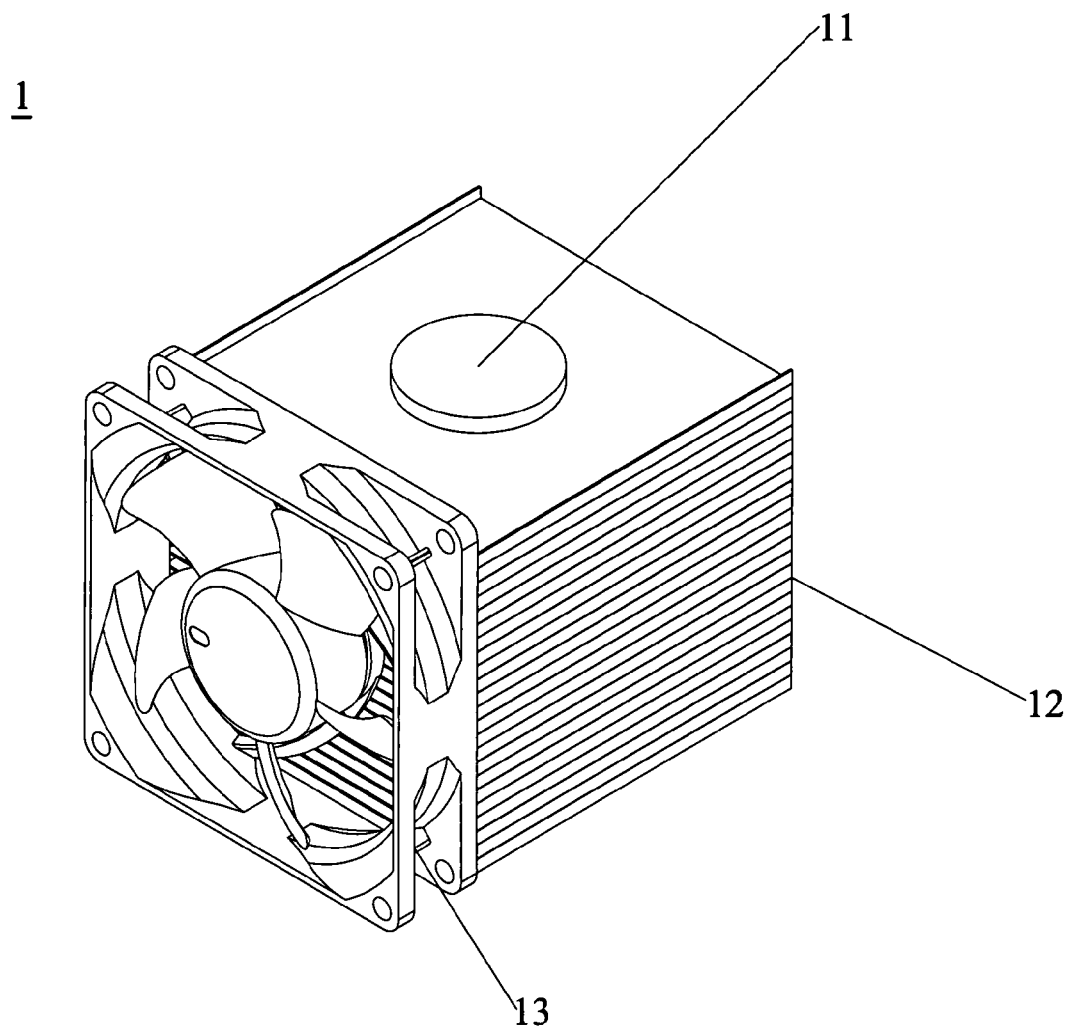
FIG. 1A is a schematic view of a conventional heat dissipating module.
Figure 1B:
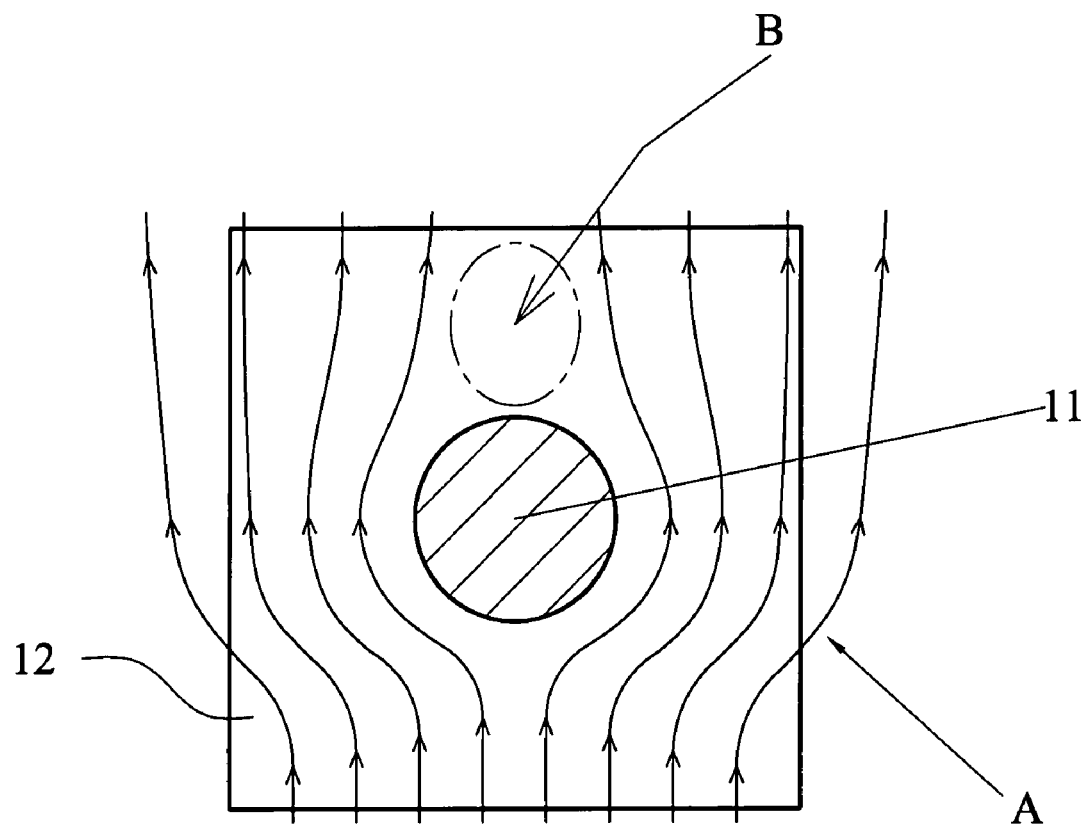
FIG. 1B is a schematic view of a fluid field of the heat dissipating module of FIG. 1A.
Figure 2A:
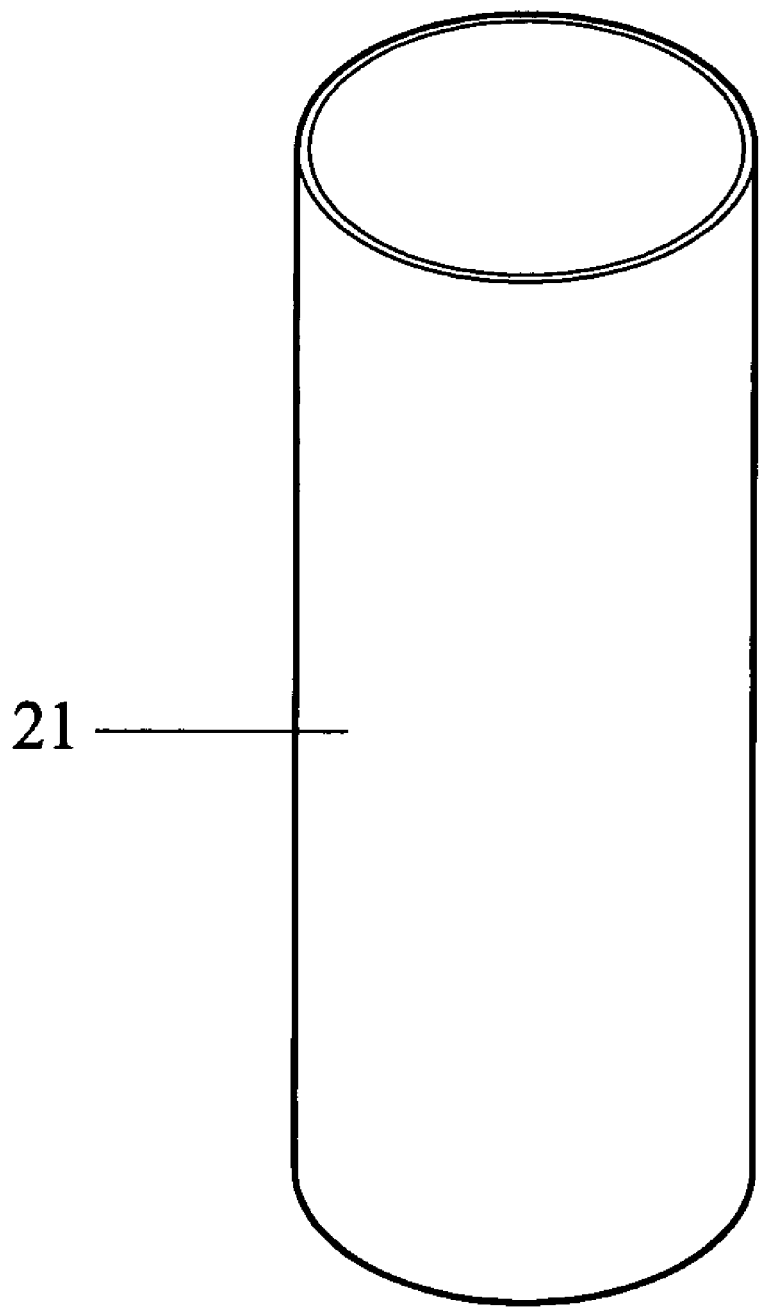
FIGS. 2A-2E depict a process of fabricating a flat heat column in accordance with an embodiment of the invention.
Figure 2B:
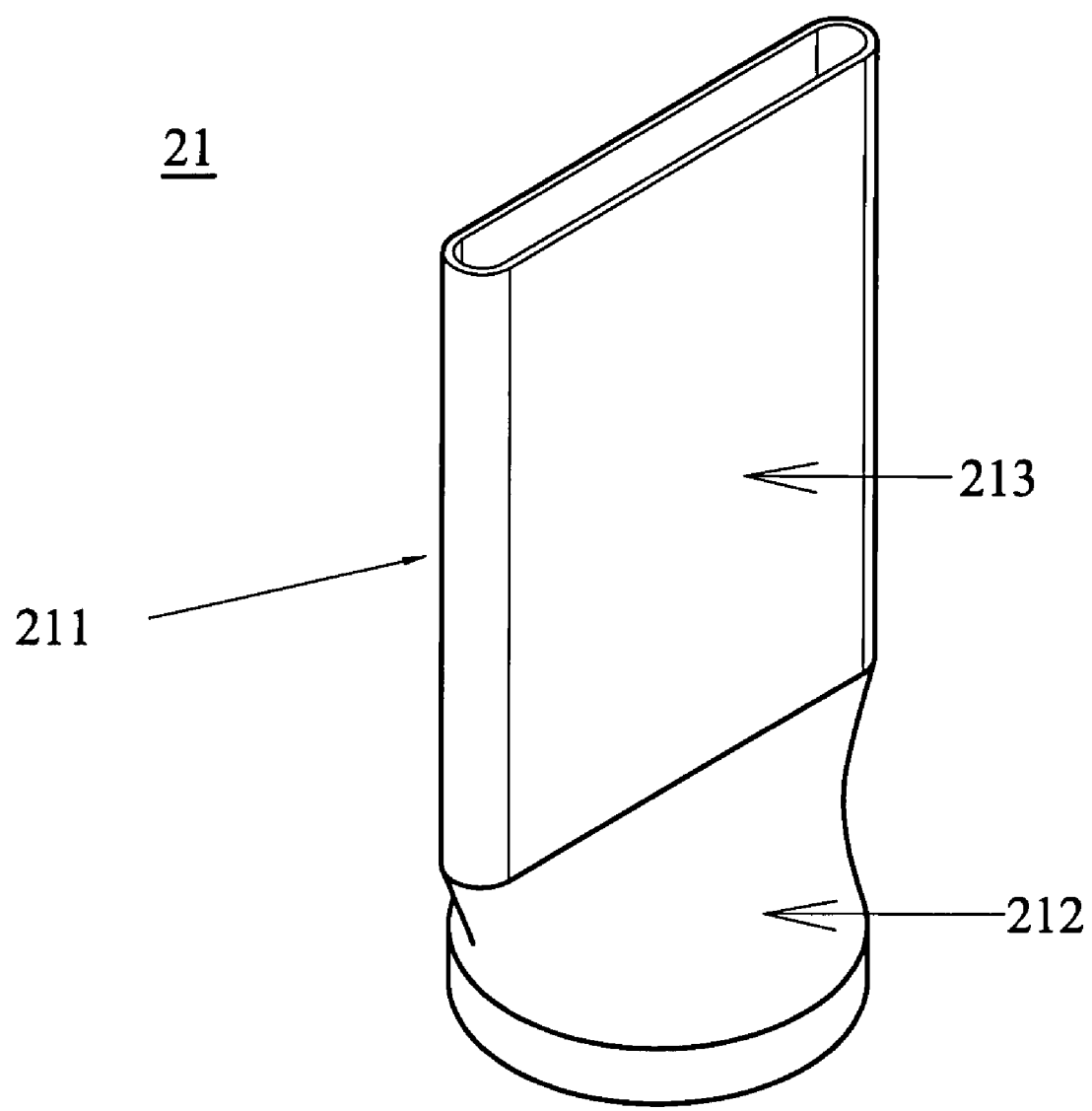
Figure 2C:
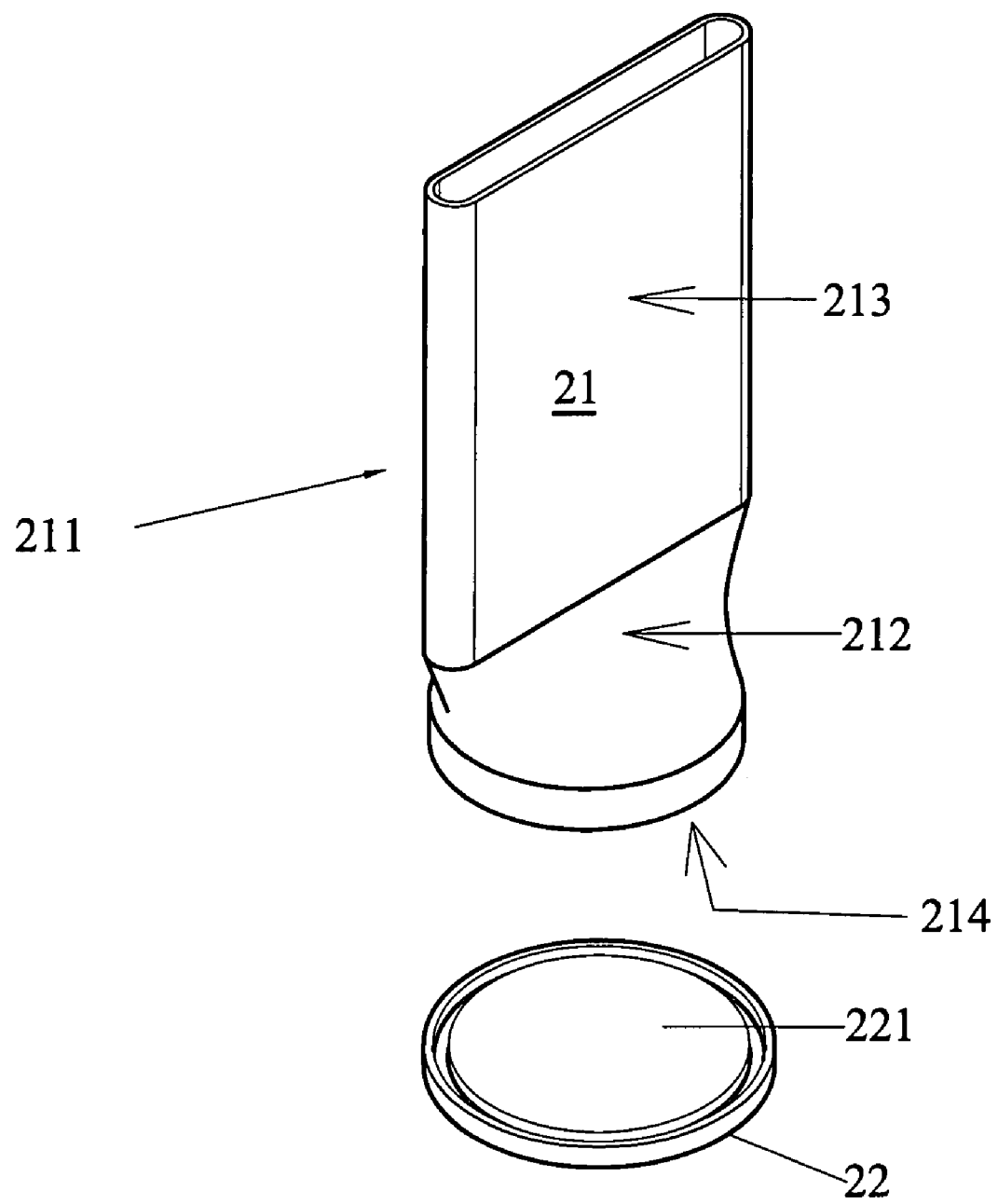

FIG. 2A shows a hollow pipe body 21. The hollow pipe body 21 is pressed to form the circular sidewall 211 into a converging part 212 and a flat part 213, wherein, as shown in Fig. 2B, the converging part 212 of the circular sidewall 211 is bell-shaped when observed from a side thereof. Then, as shown in Fig.2C, a base 22 having a wick structure 221 is provided. Then, the pipe body 21 including a converging part 212 and a flat part 213 is connected to the base 22 to close an open end 214 of the pipe body 21, wherein the dimension of the open end 214 of the pipe body 21 match the base. The circular sidewall 211 of the pipe body 21 is also provided with a wick structure. When the pipe body 21 is connected to the base 22, the wick structures on the inner wall of the pipe body and the base are joined and become continuously connected.

Figure 2D:
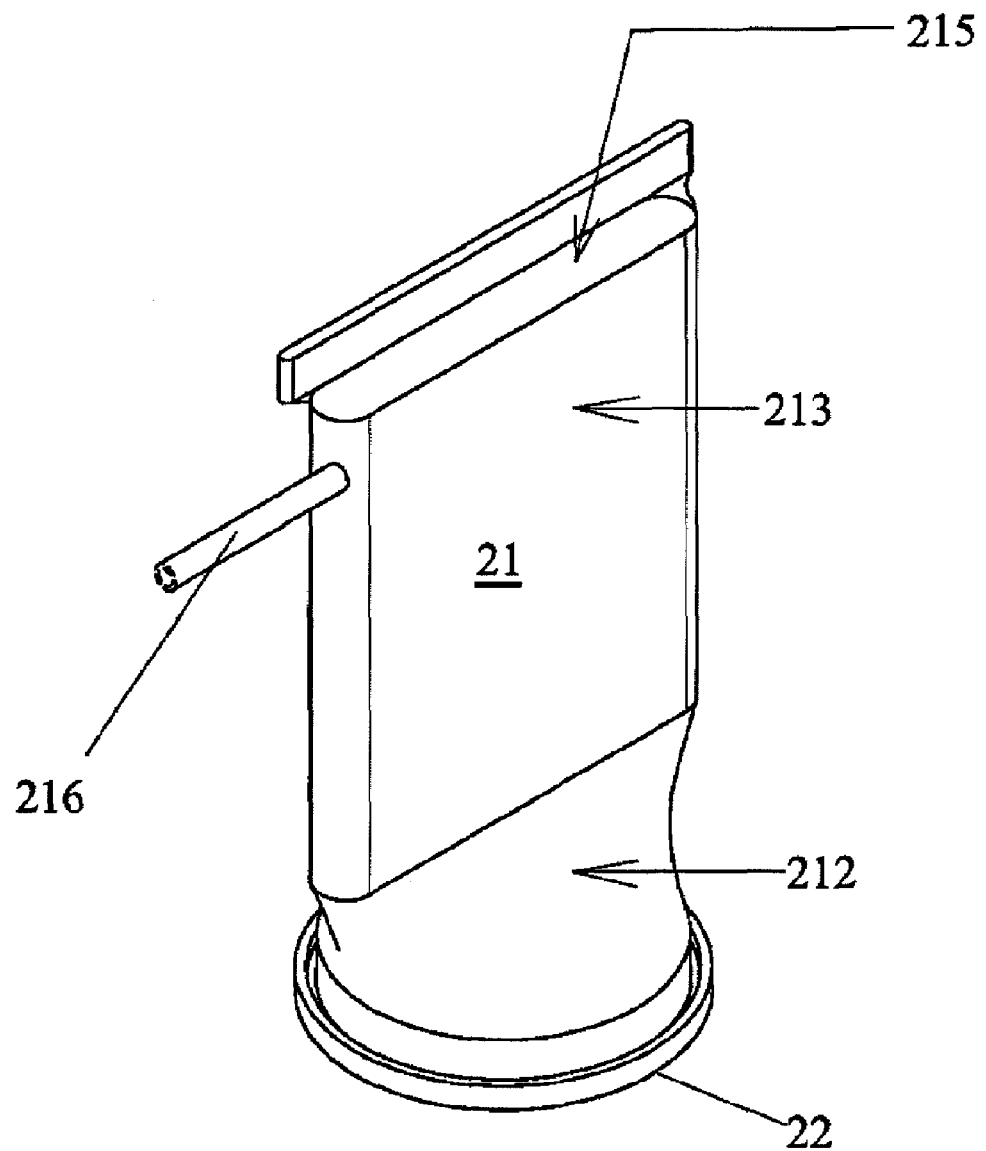

FIG. 2D shows the other open end of the pipe body 21, which is closed to form a closed end 215 subsequent to combination. FIG. 2D also shows that a working fluid is introduced into the flat heat column through a water injection pipe 216 connecting to the flat part 213 of the pipe body 21, and the air in the pipe body is pumped out through the water injection pipe 216 to form the vacuum state. The water injection pipe 216 is subsequently removed to complete the fabricating process of the flat heat column 20, as shown in FIG. 2E.

Figure 2E:
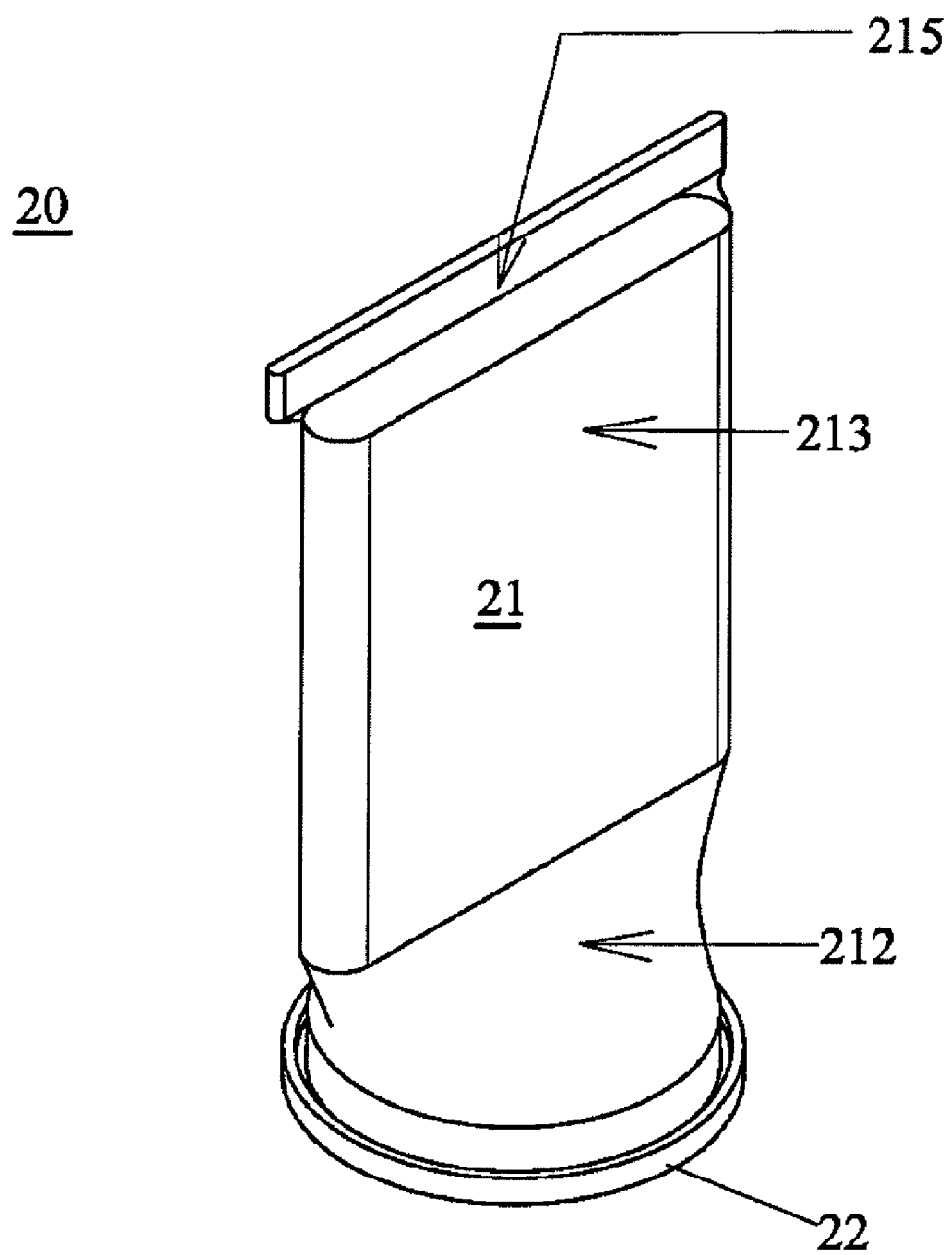
Figure 2F:
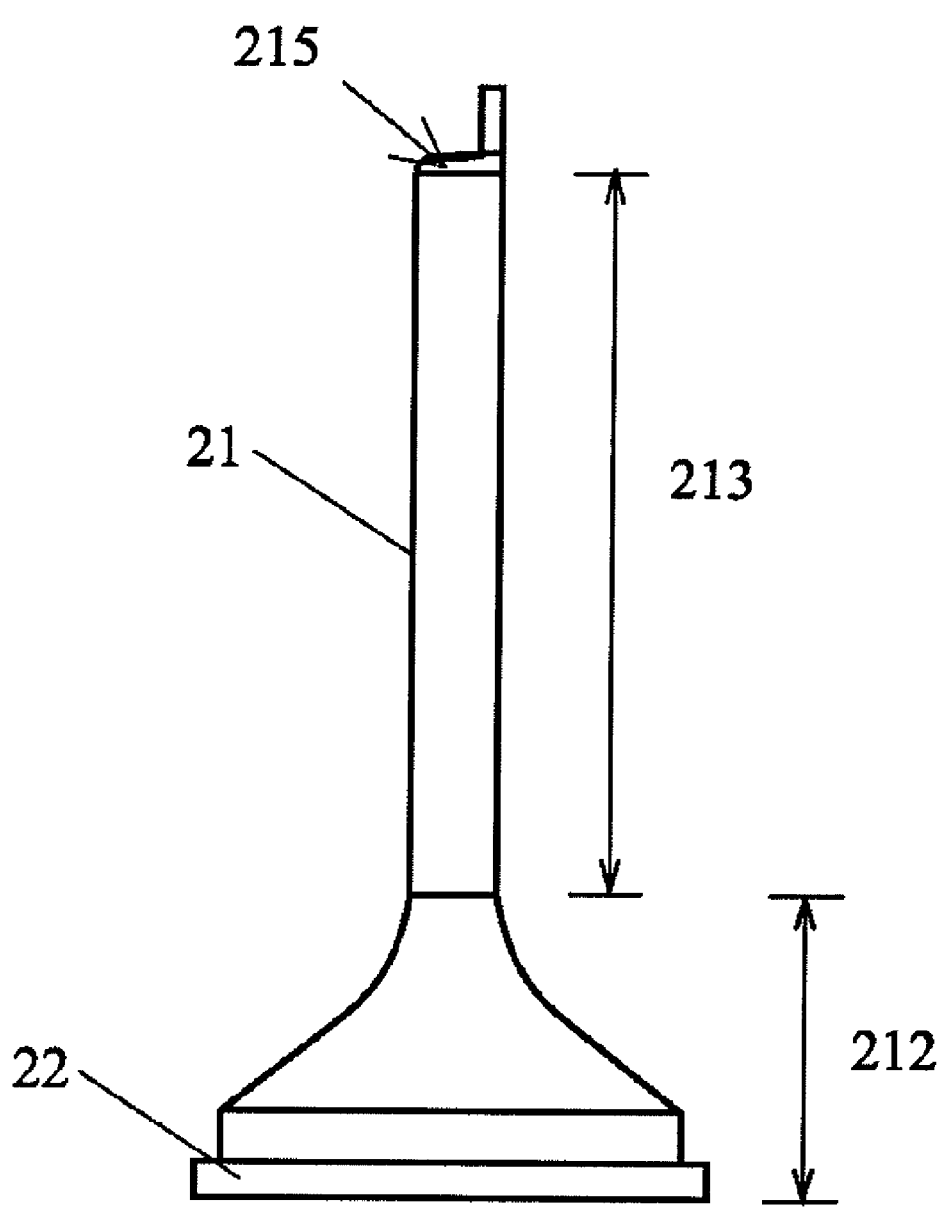
FIG. 2F is a side view of the flat heat column of FIG. 2E.

Please refer to FIGS. 2A-2E and FIG. 2F, wherein FIG. 2F is a side view of the flat heat column of FIG. 2E. In the present invention, an embodiment of the flat heat column 20 includes a pipe body 21 and a base 22. The pipe-body 21 includes a circular sidewall 211, an open end 214 and a closed end 215. The open end 214 and the closed end 215 are opposite ends of the circular sidewall 211. The circular sidewall 211 converges from the open end 214 toward the closed end 215 to form a converging part 212 and a flat part 213, and the closed end 215 connected to the flat part 213 is formed by pressing. The base 22 is coupled to the pipe body 21 at the open end 214 to form a closed space in the flat heat column 20.

Figure 3A:
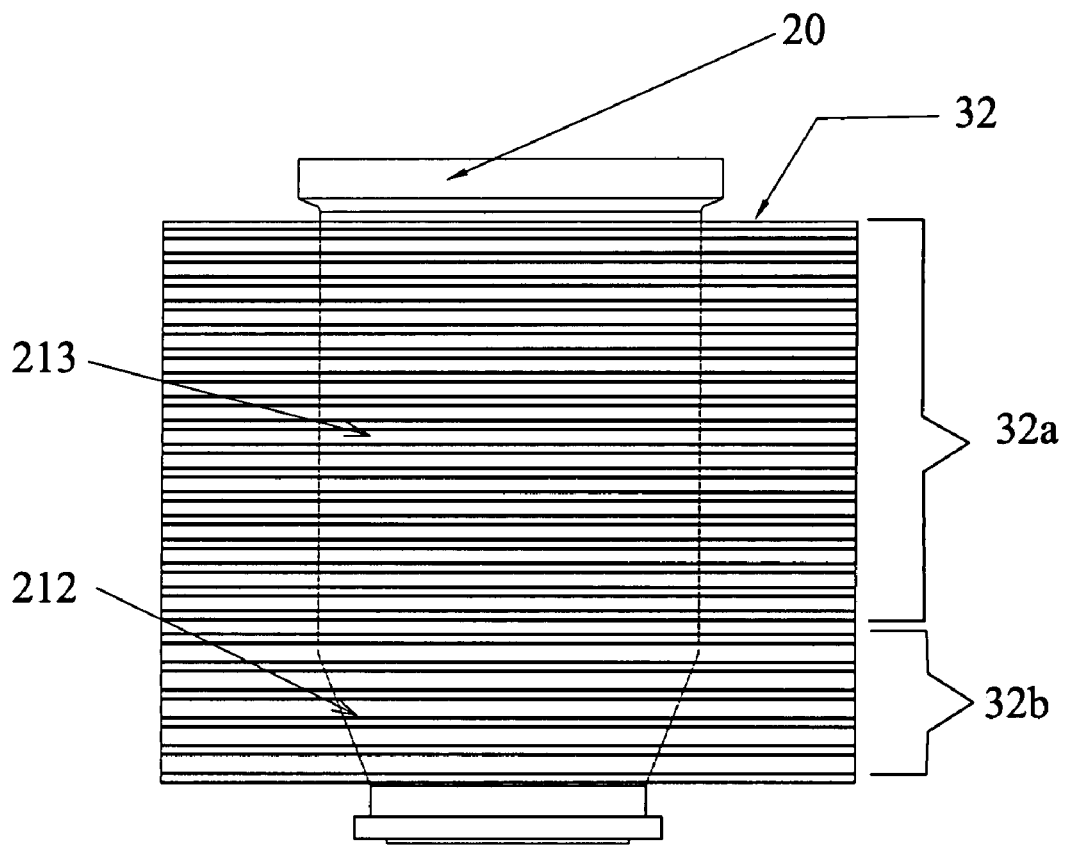
FIG. 3A is a front view of a heat dissipating apparatus of an embodiment of the invention.
Figure 3B:
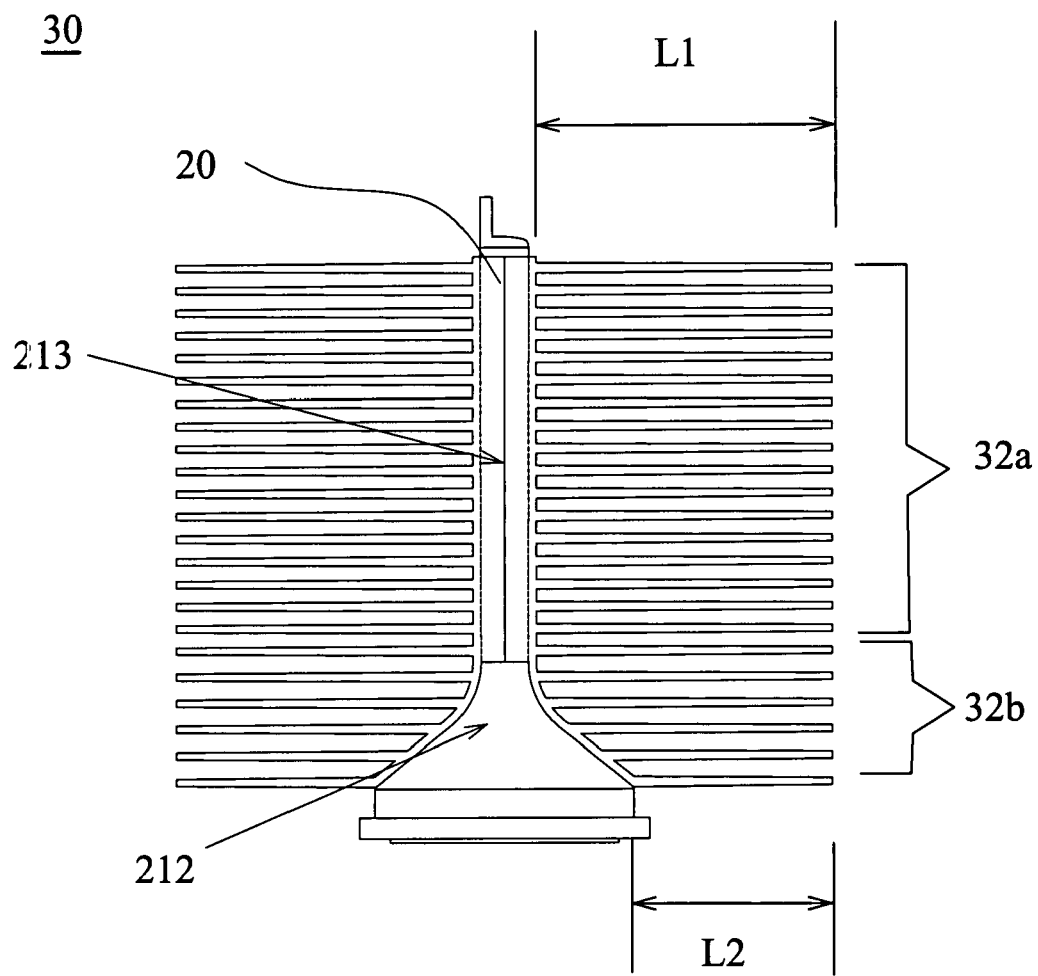
FIG. 3B is a side view of a heat dissipating apparatus of an embodiment of the invention.

Please refer to FIG. 2E, FIG. 3A and FIG. 3B, FIG. 3A is a front view of an embodiment of a heat dissipating apparatus of the present invention, and FIG. 3B is a side view of an embodiment of a heat dissipating apparatus of the invention. In the invention, an embodiment of a heat dissipating apparatus 30 includes the foregoing flat heat column 20 and a plurality of heat dissipating fins 32. The heat dissipating fins 32 are disposed at the exterior of the flat heat column 20 and connect to the flat part 213 and the converging part 212 of the flat heat column 20.

The heat dissipating fins 32a connected to the flat part 213 and the heat dissipating fins 32b connected to the converging part 212 can be similar or different. As shown in Fig.3B, for example, the heat dissipating fins 32 are diced into two kinds: the heat dissipating fins 32b connected to the converging part 212 and the heat dissipating fins 32a connected to the flat part 213, and the heat dissipating fins 32a are different from the heat dissipating fins 32b. In detail, the heat dissipating fins 32a are of the first length L1. The heat dissipating fins 32b are of the second length L2. The first length L1 is longer than the second length L2.

The heat dissipating fins 32a, 32b are produced by extrusion, clipping and locking, pressing or other method. The heat dissipating fins 32a, 32b and the flat heat column 20 are connected by tightly pressing, welding or other equivalent ways. A solder paste, a silicon heat conductive paste or a thermally conductive material is disposed between the heat dissipating fins 32a, 32b and the flat heat column 20. The heat dissipating fins 32a, 32b may be arranged in a horizontal direction or vertical direction, or extend slantingly or radially or in other manners.

Figure 4:
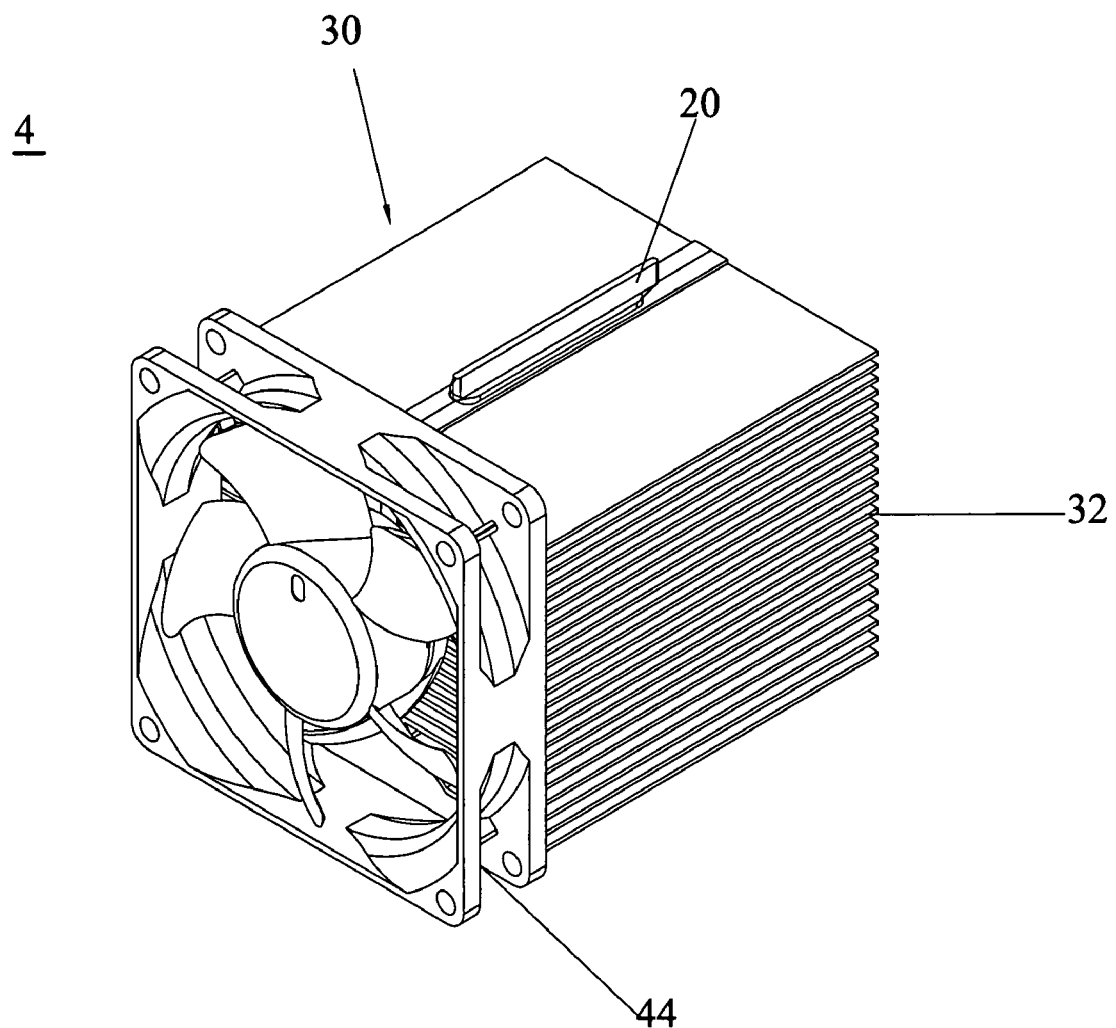
FIG. 4 is a schematic view of a heat dissipating module in accordance with an embodiment of the invention.

Please refer to FIG. 4, which is a sectional view of an embodiment of a heat dissipating module of the present invention. In FIG. 4 the heat dissipating module 4 includes the foregoing heat dissipating apparatus 30 and a fan 44. The fan 44 is disposed adjacent to a side of the heat dissipating apparatus 30 and is secured by embedding, engaging, screwing, or other equivalent ways. The fan 44 generates airflows to improve heat dissipating efficiency of the heat dissipating fans 32. Noted that the heat dissipating apparatus 30 includes the foregoing flat heat column 20 and a plurality of foregoing heat dissipating fins 32. In this embodiment, the flat heat column 20 and heat dissipating fins 32 of the heat dissipating apparatus 30 are identical to the flat heat column 20 and heat dissipating fins 32 of FIG. 2E and FIG. 3B, thus descriptions thereof are omitted.

Figure 5:
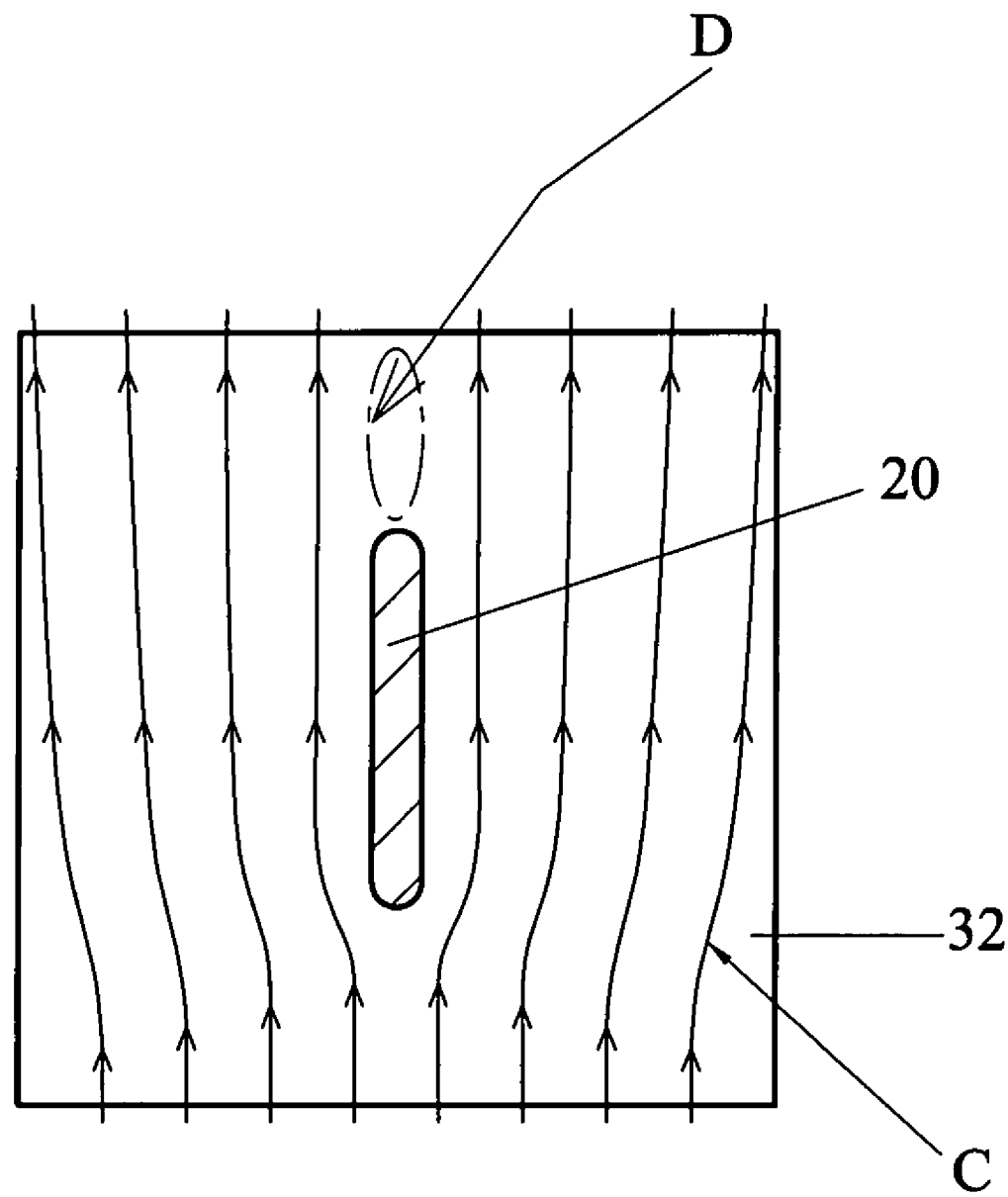
FIG. 5 is a sectional view of a fluid field of the heat dissipating module of FIG. 4.

FIG. 5 is a schematic view of a fluid field of the heat dissipating module of FIG. 4. When the heat dissipating module 4 dissipates heat from a heat source, the heat is conducted to the surface of the heat dissipating fins 32 through the flat heat column 20, and the fan 44 generates the airflow C to exhaust heat from the heat dissipating fins 32 by heat convection. When entering gaps between the heat dissipating fins 32 and passing by the flat part 213 of the flat heat column 20, the airflow C travels in a path straighter than in conventional designs. Thus, stagnant zone D of the leeward side of the flat heat column 20 can be reduced effectively. Furthermore, the conductive area of the base near the heat source is not reduced because the flat heat column 20 includes the flat part 213 and the converging part 212. The heat can be dissipated effectively from the heat dissipating fins 32 next to the flat part 213. Thus, the dissipation effect of the entire heat dissipating is relatively improved.

The heat source is an electronic device generating heat, such as a central processing unit(CPU), a transistor, a server, an advanced graphics card, a hard disk drive, a power supply, a traffic control system, an electronic multimedia apparatus, a wireless communication base station or a game console.

Figure 6:
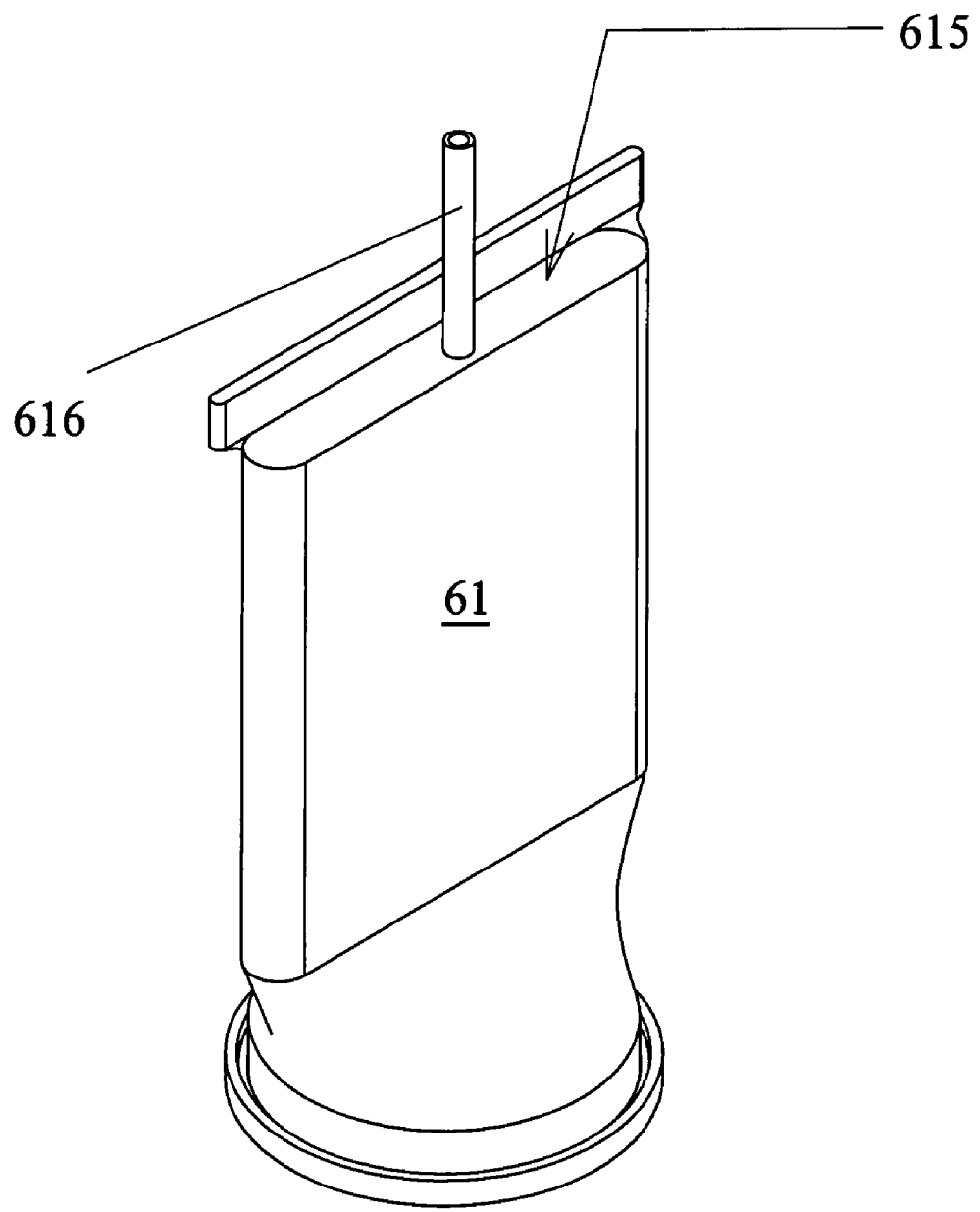
FIG. 6 depicts another arrangement of the water injection pipe of FIG. 2D.

The present invention is not limited to the disclosed embodiments. For example, the water injection pipe 216 of FIG. 2D connects to the flat part 213. In practice, however, the water injection pipe can be disposed at any suitable locations on the pipe body. Please refer to FIG. 6, which depicts another arrangement of the water injection pipe. The water injection pipe 616 is connected to the closed end 615 of the pipe body 61. The heat dissipating fins, coupled to the flat heat column of the present invention, can be manufactured by pressing, clipping and locking, or by inexpensive and simple aluminum extrusion. The heat dissipating fins can further be varied in thickness, wherein the lower fins near the heat source are thicker than the upper fins and thus have a larger heat dissipation area to promote the heat-dissipating efficiency.

While the invention has been described by way of example and in terms of preferred embodiment, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A flat heat column, comprising:
    a pipe-body comprising a circular sidewall, an open end and a closed end; and
    a base coupled to the circular sidewall at the open end to form a closed space in the flat heat column, wherein the circular sidewall converges from the open end toward the closed end to form a converging part and a flat part, wherein the converging part has a curved surface.

2. The flat heat column as claimed in claim 1, wherein a side of the converging part is bell-shaped, and a dimension of the open end match the base.

3. The flat heat column as claimed in claim 1, wherein flat heat column is used corporately with a plurality of heat dissipating fins, the heat dissipating fins are connected to the converging part and the flat part, and the heat dissipating fins connected to the converging part are different from the heat dissipating fins connected to the flat part.

4. The flat heat column as claimed in claim 1, further comprising a wick structure disposed on both the circular sidewall and the base, and the wick structure comprises plastic, metal, alloy, porous metallic material or combinations thereof.

5. The flat heat column as claimed in claim 4, wherein the flat heat column comprises a working fluid disposed in the pipe-body, the working fluid is filled within the flat heat column, and the working fluid comprises an inorganic compound, pure water, alcohol, ketone, liquid metal, coolant, an organic compound or combinations thereof.

6. The flat heat column as claimed in claim 5, wherein the working fluid is introduced into the flat heat column through a water injection pipe, and the water injection pipe is connected to the flat part and is located at the closed end of the pipe body.

7. The flat heat column as claimed in claim 1, wherein the closed end is formed by pressing.

8. The flat heat column as claimed in claim 1, wherein the pipe body and the base comprise a high thermally conductive material, such as copper, silver, aluminum or combinations thereof.

9. The flat heat column as claimed in claim 1, wherein the base contacts with a heat source which is an electronic device generating heat, such as a central processing unit(CPU), a transistor, a sever, an advanced graphics card, a hard disk drive, a power supply, a traffic control system, a multimedia electronic machine, a wireless communication base station or a high-level game console.

10. A heat dissipating apparatus, comprising:
    a flat heat column comprising a pipe-body and a base, wherein the pipe body comprises a circular sidewall, an open end and a closed end; the base is coupled to the circular sidewall at the open end to form a closed space in the flat heat column, and the circular sidewall converges from the open end toward the closed end to form a converging part and a flat part; and
    a plurality of heat dissipating fins, disposed at an exterior of the flat heat column,
    wherein the heat dissipating fins are connected to the converging part and the flat part, and the heat dissipating fins connected to the converging part are different from the heat dissipating fins connected to the flat part.

11. The heat dissipating apparatus as claimed in claim 10, wherein a side of the converging part is bell-shaped, and a dimension of the open end match the base.

12. The heat dissipating apparatus as claimed in claim 10, wherein the heat dissipating fins connected to the flat part are longer than the heat dissipating fins connected to the converging part.

13. The heat dissipating apparatus as claimed in claim 10, wherein the heat dissipating fins are produced by extrusion, clipping and locking, or pressing.

14. The heat dissipating apparatus as claimed in claim 10, wherein the heat dissipating fins and the flat heat column are connected by tightly pressing or welding.

15. The heat dissipating apparatus as claimed in claim 10, further comprising a thermally conductive material, disposed between the heat dissipating fins and the flat heat column, such as a solder paste or silicon heat conductive paste.

16. The heat dissipating apparatus as claimed in claim 10, wherein the heat dissipating fins are arranged in a horizontal direction or vertical direction, or extend slantingly or radially.

17. The heat dissipating apparatus as claimed in claim 10, wherein the flat heat column comprises a working fluid disposed in the pipe-body, and the working fluid is introduced into the flat heat column through a water injection pipe.

18. The heat dissipating apparatus as claimed in claim 17, wherein the water injection pipe is connected to the flat part and is located at the closed end of the pipe body.

19. A heat dissipating module, comprising:
    a heat dissipating apparatus, comprising:
        a flat heat column comprising a pipe-body and a base, wherein the pipe body comprises a circular sidewall, an open end and a closed end; the base is coupled to the circular sidewall at the open end to form a closed space in the flat heat column, and the circular sidewall converges from the open end toward the closed end to form a converging part and a flat part; and
        a plurality of heat dissipating fins, disposed at an exterior of the flat heat column; and
    a fan, disposed adjacent to a side of the heat dissipating apparatus, wherein the heat dissipating fins are connected to the converging part and the flat part, and the heat dissipating fins connected to the converging part are different from the heat dissipating fins connected to the flat part.

* * * * *